(12) United States Patent
Nakamura et al.

(10) Patent No.: US 10,774,441 B2
(45) Date of Patent: Sep. 15, 2020

(54) SILICON CARBIDE EPITAXIAL SUBSTRATE AND SILICON CARBIDE SEMICONDUCTOR DEVICE

(71) Applicant: MITSUBISHI ELECTRIC CORPORATION, Chiyoda-ku (JP)

(72) Inventors: Yu Nakamura, Tokyo (JP); Kazuya Konishi, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 16/375,455

(22) Filed: Apr. 4, 2019

(65) Prior Publication Data

US 2019/0226118 A1    Jul. 25, 2019

Related U.S. Application Data

(62) Division of application No. 15/749,621, filed as application No. PCT/JP2016/085525 on Nov. 30, 2016, now Pat. No. 10,415,154.

(30) Foreign Application Priority Data

Dec. 2, 2015 (JP) ................................. 2015-235372

(51) Int. Cl.
  *H01L 29/15*  (2006.01)
  *H01L 31/0312*  (2006.01)
  (Continued)

(52) U.S. Cl.
  CPC ............ *C30B 25/20* (2013.01); *C30B 25/186* (2013.01); *C30B 29/36* (2013.01);
  (Continued)

(58) Field of Classification Search
  CPC ....... C30B 25/20; C30B 25/186; C30B 29/36; H01L 21/205; H01L 29/0878;
  (Continued)

(56) References Cited

U.S. PATENT DOCUMENTS

| 7,538,412 B2 | 5/2009 | Schulze |
| 2008/0217627 A1* | 9/2008 | Friedrichs ........... H01L 29/1608 257/77 |

(Continued)

FOREIGN PATENT DOCUMENTS

| CN | 104620391 A | 5/2015 |
| DE | 10 2005 046 707 B3 | 5/2007 |

(Continued)

OTHER PUBLICATIONS

M. Skowronski, et al., "Degradation of hexagonal silicon-carbide-based bipolar devices", Journal of Applied Physics 99, 2006, Total 25 pages.

(Continued)

*Primary Examiner* — Ismail A Muse
(74) *Attorney, Agent, or Firm* — Oblon, McClelland, Maier & Neustadt, L.L.P.

(57) ABSTRACT

A silicon carbide epitaxial substrate includes a silicon carbide single-crystal substrate of one conductivity type, a first silicon carbide layer of the above-mentioned one conductivity type, a second silicon carbide layer of the above-mentioned one conductivity type, and a third silicon carbide layer of the above-mentioned one conductivity type. The silicon carbide single-crystal substrate has first impurity concentration. The first silicon carbide layer is provided on the silicon carbide single-crystal substrate, and has second impurity concentration that is lower than the first impurity concentration. The second silicon carbide layer is provided on the first silicon carbide layer, and has third impurity concentration that is higher than the first impurity concentration. The third silicon carbide layer is provided on the second silicon carbide layer, and has fourth impurity concentration that is lower than the second impurity concentration.

19 Claims, 5 Drawing Sheets

(51) Int. Cl.

| | | |
|---|---|---|
| *C30B 25/20* | (2006.01) | |
| *C30B 29/36* | (2006.01) | |
| *H01L 29/36* | (2006.01) | |
| *H01L 29/78* | (2006.01) | |
| *H01L 29/861* | (2006.01) | |
| *H01L 29/08* | (2006.01) | |
| *H01L 29/16* | (2006.01) | |
| *C30B 25/18* | (2006.01) | |
| *H01L 21/02* | (2006.01) | |
| *H01L 29/66* | (2006.01) | |
| *H01L 21/205* | (2006.01) | |
| *H01L 29/06* | (2006.01) | |

(52) U.S. Cl.
CPC .. *H01L 21/02378* (2013.01); *H01L 21/02447* (2013.01); *H01L 21/02505* (2013.01); *H01L 21/02529* (2013.01); *H01L 21/02576* (2013.01); *H01L 21/02579* (2013.01); *H01L 21/205* (2013.01); *H01L 29/0878* (2013.01); *H01L 29/1608* (2013.01); *H01L 29/36* (2013.01); *H01L 29/66068* (2013.01); *H01L 29/7802* (2013.01); *H01L 29/7813* (2013.01); *H01L 29/8613* (2013.01); *H01L 29/0615* (2013.01)

(58) Field of Classification Search
CPC . H01L 29/8613; H01L 29/36; H01L 29/1608; H01L 29/7813
See application file for complete search history.

(56) References Cited

U.S. PATENT DOCUMENTS

| | | |
|---|---|---|
| 2009/0256197 A1 | 10/2009 | Nakazawa et al. |
| 2012/0105094 A1 | 5/2012 | Konstantinov |
| 2012/0228638 A1 | 9/2012 | Das |
| 2012/0267681 A1 | 10/2012 | Nemoto |
| 2013/0049014 A1 | 2/2013 | Aigo et al. |
| 2014/0110723 A1 | 4/2014 | Ikegami |
| 2014/0246750 A1 | 9/2014 | Takishita |
| 2015/0028354 A1* | 1/2015 | Das ............... H01L 29/0873 257/77 |
| 2015/0179441 A1* | 6/2015 | Onozawa ............ H01L 29/36 257/109 |
| 2016/0071971 A1 | 3/2016 | Kudou |
| 2016/0087623 A1 | 3/2016 | Yamaguchi |
| 2016/0181374 A1 | 6/2016 | Hiyoshi |
| 2017/0077285 A1 | 3/2017 | Uehara |
| 2017/0271442 A1 | 9/2017 | Uehara |
| 2017/0271450 A1 | 9/2017 | Takahashi |
| 2018/0358463 A1 | 12/2018 | Kobayashi |

FOREIGN PATENT DOCUMENTS

| | | |
|---|---|---|
| JP | 2007-250693 A | 9/2007 |
| JP | 2008-74661 A | 4/2008 |
| JP | 2011-114252 A | 6/2011 |
| JP | 2011-236085 A | 11/2011 |
| WO | WO 2008/088019 A1 | 7/2008 |

OTHER PUBLICATIONS

K. Irmscher, et al. "Formation and properties of stacking faults in nitrogen-doped 4H-SiC", Physica B 376-377, 2006, Total 4 pages.
International Search Report dated Feb. 21, 2017 in PCT/JP2016/085525 filed Nov. 30, 2016.
Japanese Office Action dated Jan. 30, 2019 in Japanese Patent Application No. 2018-701059 (with partial English translation), 46 pages.
Myers-Ward, R.L., et al., "Spontaneous Conversion of Basal Plane Dislocations in 4☐ Off-Axis 4H-SiC Epitaxial Layers", ACS Publications, Crystal Growth & Design, 2014, pp. 5331-5338 (with cover page).
German Office Action dated May 8, 2019 in German Patent Application No. 11 2016 004 194.2 (with English translation), 10 pages.
Office Action dated May 28, 2020 in German Patent Application No. 11 2016 004 194.2, 4 pages. (Submitting English translation only; Office Action in German was previously filed on Jun. 15, 2020.).
Office Action dated Jul. 30, 2020 in Chinese Patent Application No. 201680051471. 2, 16 pages.

* cited by examiner

SILICON CARBIDE EPITAXIAL SUBSTRATE AND SILICON CARBIDE SEMICONDUCTOR DEVICE

CROSS-REFERENCE TO RELATED APPLICATIONS

This application is a Division of Ser. No. 15/749,621, filed on Feb. 1, 2018, which is a U.S. National Stage Application of International Application No. PCT/JP2016/085525, filed on Nov. 30, 2016, which claims priority from Japanese Patent Application No. 2015-235372 filed on Dec. 2, 2012. The entirety of all the above-listed applications are incorporated herein by reference.

TECHNICAL FIELD

The present invention relates to a silicon carbide epitaxial substrate and a silicon carbide semiconductor device.

BACKGROUND ART

Silicon carbide single crystals have excellent physical properties such as large dielectric breakdown field strength and high thermal conductivity. For this reason, a semiconductor device using silicon carbide instead of silicon that hitherto has been widely used as a semiconductor material, that is, a silicon carbide semiconductor device, is expected as a high-performance semiconductor device, in particular, as a power device. The silicon carbide exists in crystal polymorphs of different crystal structures (so-called 2H, 3C, 4H, 6H, 8H, or 15R type and such), although having the same chemical formula. Among above, 4H-type silicon carbide is suitable for the use of such a power device that copes with a high voltage. "H" herein represents a crystal polymorph of a hexagonal system (hexagonal), and "4" represents a structural unit in which a double-atomic layer formed of Si (silicon) and C (carbon) are stacked four times. The 4H-type silicon carbide particularly has advantages as a material of a substrate for a power device. Specifically, the bandgap thereof is as wide as 3.26 eV, and further, anisotropy of electron mobility is low in a direction parallel to the c-axis and a direction perpendicular thereto.

In general, a silicon carbide single-crystal substrate is manufactured with a method in which a raw material containing Si and C is sublimated inside a crucible to grow crystals on a seed crystal (sublimation recrystallization method). In order to obtain as many silicon carbide semiconductor devices as possible from one substrate with high yield, it is required that the entire silicon carbide single-crystal substrate have uniform crystals of a single crystal polymorph. In order to enhance productivity while satisfying such a requirement, efforts have been made to increase the size of the substrate. Hitherto, the diameter of a commercially available substrate had been up to 100 mm (4 inches); however, the size has increased to be as large as 150 mm (6 inches) at the present.

In the manufacture of the silicon carbide semiconductor device, there is used a silicon carbide epitaxial substrate including the silicon carbide single-crystal substrate and a silicon carbide layer provided thereon through epitaxial growth. Typically, the epitaxial growth is conducted with a chemical vapor deposition (CVD) method that uses a source gas containing Si atoms and C atoms. At least a part of an epitaxial layer is used as an active layer in which a semiconductor element structure is to be formed. Adjustment of impurity concentration and a thickness of the active layer enables adjustment of a withstand voltage and element resistance of a semiconductor device. Specifically, a semiconductor device having a higher withstand voltage can be obtained as the impurity concentration inside the active layer is lower, further, as the thickness of the active layer is larger.

Commercially available silicon carbide single-crystal substrates have crystal defects at high density as compared to silicon single-crystal substrates or the like. Propagation of the crystal defects from the single-crystal substrate to the epitaxial growth layer (i.e., to the active layer) at the time of epitaxial growth may adversely affect operations of the silicon carbide semiconductor device. As typical crystal defects of silicon carbide, there are given a threading screw dislocation, a threading edge dislocation, a basal plane dislocation, a stacking fault, and the like. The basal plane dislocation is decomposed into two partial dislocations, accompanying a stacking fault therebetween. When a bipolar device such as a PIN diode is energized in a forward direction, the stacking fault traps injected carriers and expands an area thereof. It is known that increase in forward voltage drop of the device is caused due to the above (refer to Non-Patent Document 1: JOURNAL OF APPLIED PHYSICS 99, 011101 (2006), for example). This phenomenon is hereinafter referred to as "energized deterioration." Further, the expression of the "basal plane dislocation" as used in this specification connotes the above-mentioned "two partial dislocations."

It is known that many of the basal plane dislocations inside a silicon carbide substrate having a surface being a plane inclined by several degrees with respect to a (0001) plane are, at the time of epitaxial growth with the CVD method, converted into threading edge dislocations, which affect the device to a lesser extent. In order to suppress the above-mentioned energized deterioration, various attempts have been made to enhance a rate of converting the basal plane dislocation inside the substrate into the threading edge dislocation at the time of epitaxial growth (conversion rate).

According to Japanese Patent Application Laid-Open No. 2007-250693 (Patent Document 1), for example, a second epitaxial growth layer having impurity concentration of $3 \times 10^{19}$ $cm^{-3}$ or more is formed in the middle of a first epitaxial growth layer. In the second epitaxial growth layer, crystal strain abruptly becomes larger. According to the above-mentioned publication, there is a description as for the capability of conversion into a dislocation that is less liable to adversely affect electrical properties by changing orientation of the dislocation. In this method, however, the formation of the second epitaxial growth layer having high impurity concentration itself may be a factor of generating the stacking fault (refer to Non-Patent Document 2: PHYSICA B 376-377, 338 (2006), for example). Further, the abrupt change in a profile of impurity concentration between the first epitaxial growth layer and the second epitaxial growth layer may newly generate a basal plane dislocation adversely. Therefore, effectiveness of this method was low in actuality.

Further, according to Japanese Patent Application Laid-Open No. 2008-74661 (Patent Document 2), for example, there is disclosed a silicon carbide epitaxial substrate including, on the silicon carbide single-crystal substrate, a suppressing layer for suppressing density of basal plane dislocations and an active layer formed on the suppressing layer. The suppressing layer has a structure in which nitrogen concentration is reduced toward the active layer side in a stepwise manner.

PRIOR ART DOCUMENTS

Patent Documents

Patent Document 1: Japanese Patent Application Laid-Open No. 2007-250693
Patent Document 2: Japanese Patent Application Laid-Open No. 2008-74661

Non-Patent Documents

Non-Patent Document 1: JOURNAL OF APPLIED PHYSICS 99, 011101 (2006)
Non-Patent Document 2: PHYSICA B 376-377, 338 (2006)

SUMMARY

Problem to be Solved by the Invention

When the inventors of the present invention investigated the method described in Japanese Patent Application Laid-Open No. 2008-74661 in the above, the density of basal plane dislocations of the active layer inside the silicon carbide epitaxial substrate was suppressed, but energized deterioration of a bipolar device manufactured with use of this substrate was not suppressed adequately.

Note that, the "bipolar device" as used in this specification also includes, in addition to a device performing only the bipolar operation, a device performing a bipolar operation and a unipolar operation. Thus, even a metal oxide semiconductor field effect transistor (MOSFET), which is in many cases categorized as a unipolar device in general, corresponds to the "bipolar device" as used in this specification in a case where a parasitic PIN diode thereof operates as a bipolar element. Such a parasitic PIN diode is oftentimes utilized as a built-in diode of the MOSFET.

The present invention is made in order to solve the problems as described above, and an object thereof is to provide a silicon carbide epitaxial substrate and a silicon carbide semiconductor device that are capable of suppressing energized deterioration at the time of a bipolar operation.

Means to Solve the Problem

A silicon carbide epitaxial substrate of the present invention includes a silicon carbide single-crystal substrate of one conductivity type, a first silicon carbide layer of the above-mentioned one conductivity type, a second silicon carbide layer of the above-mentioned one conductivity type, and a third silicon carbide layer of the above-mentioned one conductivity type. The silicon carbide single-crystal substrate has first impurity concentration. The first silicon carbide layer is provided on the silicon carbide single-crystal substrate, and has second impurity concentration that is lower than the first impurity concentration. The second silicon carbide layer is provided on the first silicon carbide layer, and has third impurity concentration that is higher than the first impurity concentration. The third silicon carbide layer is provided on the second silicon carbide layer, and has fourth impurity concentration that is lower than the second impurity concentration.

A silicon carbide semiconductor device of the present invention includes a silicon carbide single-crystal substrate of one conductivity type, a silicon carbide single-crystal substrate of the above-mentioned one conductivity type, a first silicon carbide layer of the above-mentioned one conductivity type, a second silicon carbide layer of the above-mentioned one conductivity type, a third silicon carbide layer of the above-mentioned one conductivity type, and a fourth silicon carbide layer of a conductivity type different from the above-mentioned one conductivity type. The silicon carbide single-crystal substrate has first impurity concentration. The first silicon carbide layer is provided on the silicon carbide single-crystal substrate, and has second impurity concentration that is lower than the first impurity concentration. The second silicon carbide layer is provided on the first silicon carbide layer, and has third impurity concentration that is higher than the first impurity concentration. The third silicon carbide layer is provided on the second silicon carbide layer, and has fourth impurity concentration that is lower than the second impurity concentration. The fourth silicon carbide layer is provided on the third silicon carbide layer.

Note that, in the above, the wording of being "provided on the silicon carbide single-crystal substrate" may mean, unless otherwise particularly noted, both of being provided directly on the silicon carbide single-crystal substrate and being provided with intermediation of a certain layer on the single-crystal substrate. The same also holds for each wording of being "provided on the first silicon carbide layer," "provided on the second silicon carbide layer," and "provided on the third silicon carbide layer."

Effects of the Invention

According to the silicon carbide epitaxial substrate of the present invention, a basal plane dislocation inside the silicon carbide single-crystal substrate is converted into a threading edge dislocation by the first silicon carbide layer at the time of epitaxial growth for manufacturing the silicon carbide epitaxial substrate. With this, propagation of the basal plane dislocation into the third silicon carbide layer is suppressed at the time of epitaxial growth. Further, extension of the basal plane dislocation advancing toward the third silicon carbide layer from the first silicon carbide layer is hindered by the second silicon carbide layer at the time of a bipolar operation of the silicon carbide semiconductor device using this silicon carbide epitaxial substrate. Thus, at the time of a bipolar operation, energized deterioration due to the extension and expansion of the basal plane dislocation inside the third silicon carbide layer can be suppressed.

According to the silicon carbide semiconductor device of the present invention, a basal plane dislocation inside the silicon carbide single-crystal substrate is converted into a threading edge dislocation by the first silicon carbide layer at the time of epitaxial growth for manufacturing the silicon carbide epitaxial substrate. With this, propagation of the basal plane dislocation into the third silicon carbide layer is suppressed at the time of epitaxial growth. Further, at the time of a bipolar operation utilizing a pin structure obtained by a stacking structure of the fourth silicon carbide layer, the third silicon carbide layer, and the silicon carbide single-crystal substrate, the extension of the basal plane dislocation advancing toward the third silicon carbide layer from the first silicon carbide layer is hindered by the second silicon carbide layer. Thus, at the time of a bipolar operation, energized deterioration due to the extension and expansion of the basal plane dislocation inside the third silicon carbide layer can be suppressed.

The object, features, aspects, and advantages of the present invention become more obvious with the detailed description below and the attached drawings.

DESCRIPTION OF EMBODIMENTS

Now, embodiments of the present invention are described with reference to the drawings. Note that, in the following drawings, the same or corresponding parts are denoted by the same reference symbols not to repeat description thereof.

First Embodiment

Figure 1:
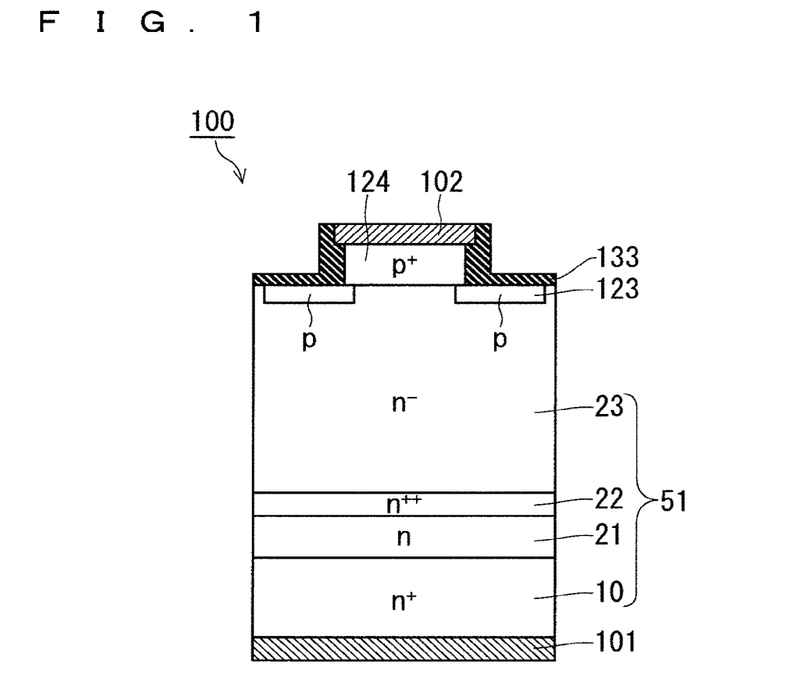
FIG. 1 is a sectional view schematically illustrating a configuration of a silicon carbide semiconductor device according to a first embodiment of the present invention.
Figure 2:
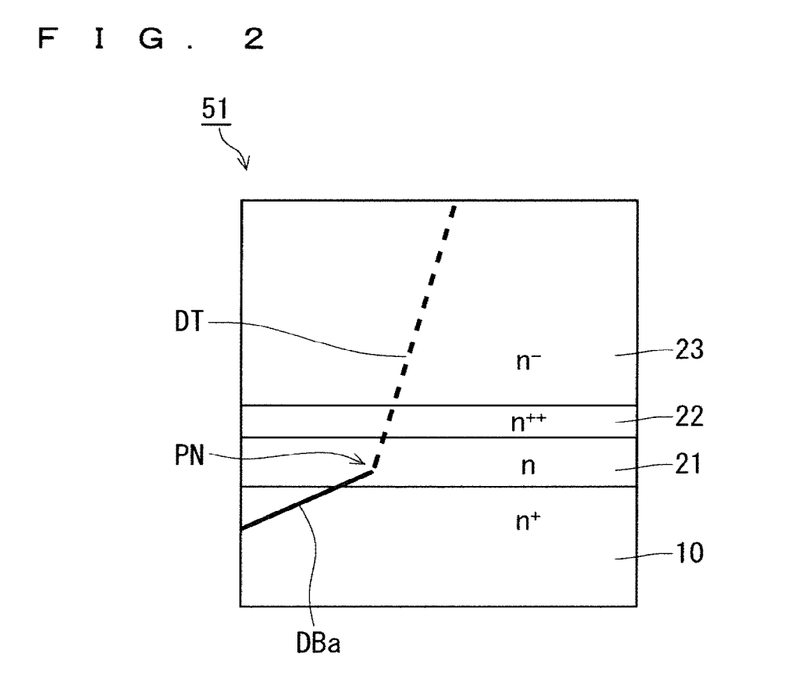
FIG. 2 is a sectional view schematically illustrating a configuration of a silicon carbide epitaxial substrate according to the first embodiment of the present invention.

With reference to FIG. 1 and FIG. 2, a PIN diode 100 (silicon carbide semiconductor device) of this embodiment is manufactured with use of a silicon carbide epitaxial substrate 51. In other words, the PIN diode 100 includes the silicon carbide epitaxial substrate 51. The silicon carbide epitaxial substrate 51 includes an n-type (one conductivity type) silicon carbide single-crystal substrate 10, an n-type first silicon carbide layer 21, an n-type second silicon carbide layer 22, and an n-type third silicon carbide layer 23 (active layer). The first silicon carbide layer 21 is provided on the silicon carbide single-crystal substrate 10. The first silicon carbide layer 21 may be provided directly on the silicon carbide single-crystal substrate 10. The second silicon carbide layer 22 is provided on the first silicon carbide layer 21. The second silicon carbide layer 22 may be provided directly on the first silicon carbide layer 21. The third silicon carbide layer 23 is provided on the second silicon carbide layer 22. The third silicon carbide layer 23 may be provided directly on the second silicon carbide layer 22. The first silicon carbide layer 21, the second silicon carbide layer 22, and the third silicon carbide layer 23 are epitaxial layers that are formed through epitaxial growth on the silicon carbide single-crystal substrate 10. The epitaxial growth may be performed with the CVD method.

The silicon carbide single-crystal substrate 10 has first impurity concentration. It is preferable that the first impurity concentration be $5 \times 10^{17}$ cm$^{-3}$ or more and $1 \times 10^{19}$ cm$^{-3}$ or less. The first silicon carbide layer 21 has second impurity concentration that is lower than the first impurity concentration. It is preferable that the second impurity concentration be selected so as to enhance a rate of converting a basal plane dislocation DBa propagating from the silicon carbide single-crystal substrate 10 into a threading edge dislocation DT at a conversion point PN inside the first silicon carbide layer 21 in epitaxial growth. In order to satisfy this object, it is preferable that the second impurity concentration be $5 \times 10^{16}$ cm$^{-3}$ or more and $1 \times 10^{19}$ cm$^{-3}$ or less. The second silicon carbide layer 22 has third impurity concentration that is higher than the first impurity concentration. In order to prevent new crystal defects from being generated, it is preferable that the third impurity concentration be $2 \times 10^{19}$ cm$^{-3}$ or less. Further, it is necessary that a lower limit value for the third impurity concentration be higher than the first impurity concentration, specifically, $5 \times 10^{18}$ cm$^{-3}$ or more. The third silicon carbide layer 23 has fourth impurity concentration that is lower than the first impurity concentration. It is preferable that the fourth impurity concentration be lower than the second impurity concentration, specifically, it is preferable that the fourth impurity concentration be $1 \times 10^{14}$ cm$^{-3}$ or more and $5 \times 10^{16}$ cm$^{-3}$ or less, and be approximately $5 \times 10^{15}$ cm$^{-3}$, for example.

The silicon carbide single-crystal substrate 10 has a crystal structure of a hexagonal system, preferably a crystal polymorph of 4H. A surface of the silicon carbide single-crystal substrate 10 on which the first silicon carbide layer 21 is provided (upper surface in the drawing) has an off-angle larger than 0° with respect to a {0001} plane. It is preferable that this off-angle be 0.05° or more, more preferably 0.1° or more. Forming an off-angle of an adequate magnitude facilitates formation of the epitaxial layer having the same crystal structure as the crystal structure of the silicon carbide single-crystal substrate 10. Further, it is preferable that this off-angle be 8° or less, more preferably 5° or less. The off-angle being not excessively large prevents the density of basal plane dislocations on the surface of the silicon carbide single-crystal substrate 10 from being excessively high. Further, it is preferable that the above-mentioned off-angle be an angle having, out of a (0001) plane and a (000-1) plane being a {0001} plane, the (0001) plane as a reference.

The PIN diode 100 further includes a p-type (conductivity type different from the one conductivity type) fourth silicon carbide layer 124, a cathode electrode 101 (first electrode), an anode electrode 102 (second electrode), a junction termination extension (JTE) region 123, and an insulation film 133. The fourth silicon carbide layer 124 is provided on the third silicon carbide layer 23. The fourth silicon carbide layer 124 may be provided directly on the third silicon carbide layer 23. The cathode electrode 101 is electrically connected to the silicon carbide single-crystal substrate 10. The cathode electrode 101 is brought into an ohmic contact with the silicon carbide single-crystal substrate 10. In order to obtain such a connection, the cathode electrode 101 may be provided directly on the silicon carbide single-crystal substrate 10. The anode electrode 102 is electrically connected to the fourth silicon carbide layer 124. The anode electrode 102 is brought into an ohmic contact with the fourth silicon carbide layer 124. In order to obtain such a connection, the anode electrode 102 may be provided directly on the fourth silicon carbide layer 124.

Figure 3:
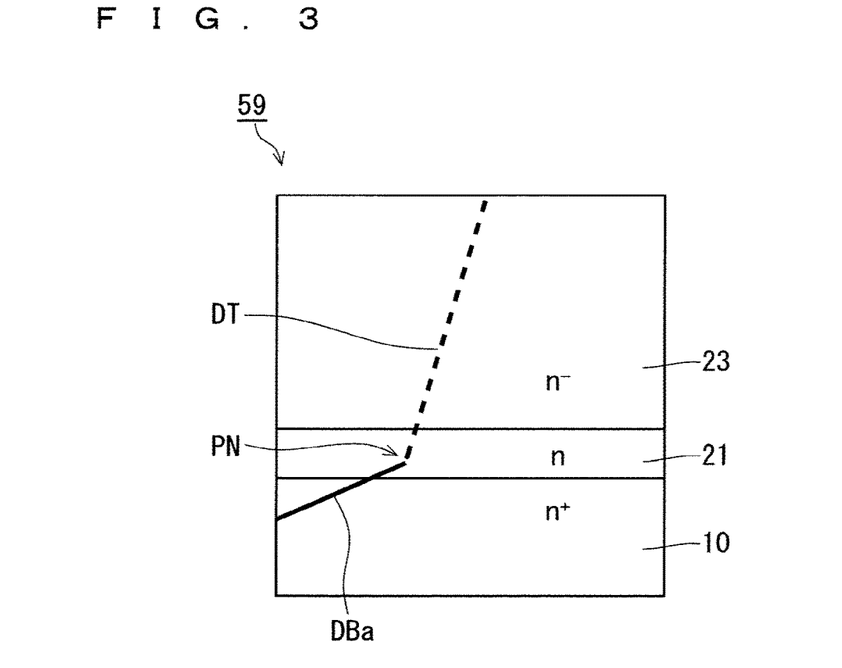
FIG. 3 is a sectional view schematically illustrating a configuration of the silicon carbide epitaxial substrate according to a comparative example.

With reference to FIG. 3, also in a silicon carbide epitaxial substrate 59 of a comparative example, similarly to the silicon carbide epitaxial substrate 51 (FIG. 2), extension of the basal plane dislocation DBa at the time of epitaxial growth is stopped at the conversion point PN inside the first silicon carbide layer 21. On the other hand, the second silicon carbide layer 22 is not provided in the silicon carbide epitaxial substrate 59 (FIG. 3).

Figure 4:
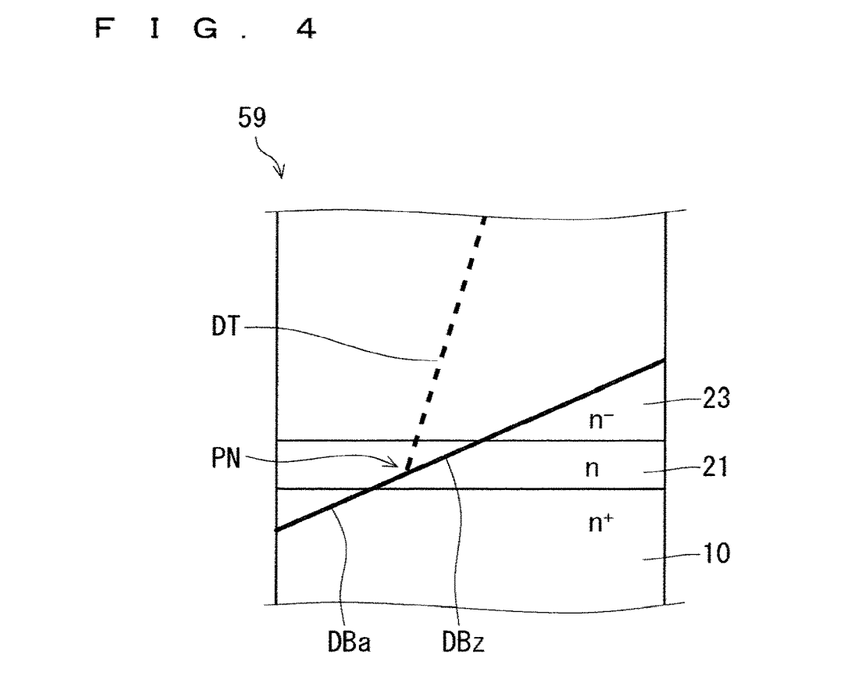
FIG. 4 is a partial sectional view illustrating a state of extension of a basal plane dislocation inside the silicon carbide epitaxial substrate at the time of a bipolar operation of the silicon carbide semiconductor device according to the comparative example.

With reference to FIG. 4, when a forward current was applied in the PIN diode (refer to FIG. 1) manufactured with use of the silicon carbide epitaxial substrate 59, which lacked in the second silicon carbide layer 22 as described above, significant energized deterioration was generated. The inventors investigated the reason to reveal that, along with the energization, a basal plane dislocation DBz extended and expanded from the basal plane dislocation DBa (i.e., a stacking fault) being present deeper than the conversion point PN (lower side in the drawing) into the third epitaxial layer 23 (active layer). Thus, in a case where a PIN diode is manufactured with use of the silicon carbide epitaxial substrate 59, energized deterioration along with a bipolar operation is significant.

In view of the above, the inventors of the present invention conceived that configuration for hindering the extension of the basal plane dislocation from the basal plane dislocation DBa being present on the lower side with respect to the conversion point PN was necessary inside the epitaxial layer. As part of the process, a relationship between the extension of the basal plane dislocation and the impurity concentration inside silicon carbide was investigated, finding that the basal plane dislocation extended in a direction toward lower impurity concentration. Further, it was also found that the extension of the basal plane dislocation was suppressed in a region having high impurity concentration, and that the extension was substantially prevented in a region having impurity concentration of $5\times10^{18}$ cm$^{-3}$ or more in particular.

Based on the discovery as described above, in the silicon carbide epitaxial substrate 51 of this embodiment (FIG. 2), the second silicon carbide layer 22 was designed to be provided on the first silicon carbide layer 21. The impurity concentration of the second silicon carbide layer 22 (third impurity concentration) was designed to be higher than the impurity concentration of the silicon carbide single-crystal substrate 10 (first impurity concentration), preferably designed to be $5\times10^{18}$ cm$^{-3}$ or more.

Figure 5:
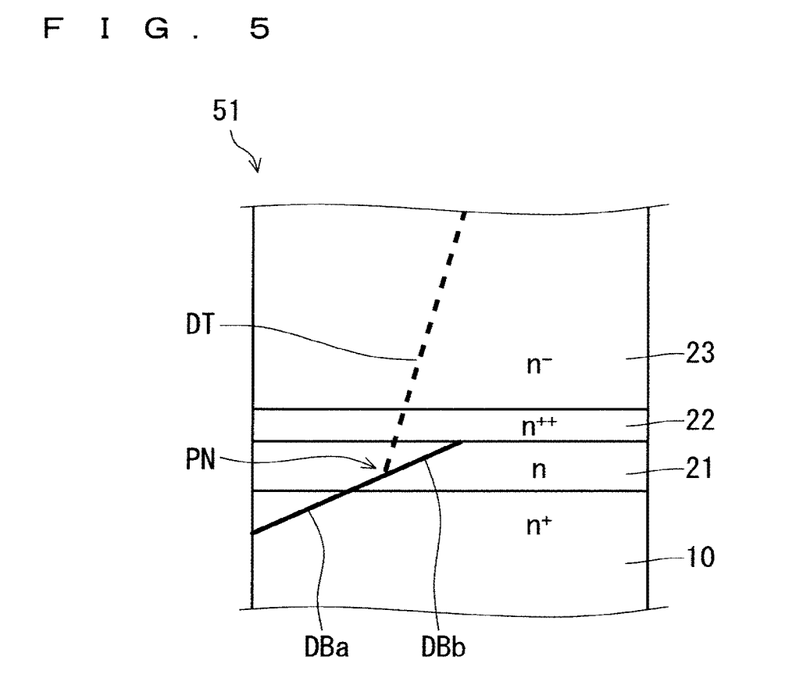
FIG. 5 is a partial sectional view illustrating a state of extension of a basal plane dislocation inside the silicon carbide epitaxial substrate at the time of a bipolar operation of the silicon carbide semiconductor device of FIG. 1.

With reference to FIG. 5, when a forward current was applied in the PIN diode 100 (FIG. 1) manufactured with use of the silicon carbide epitaxial substrate 51, in which the second silicon carbide layer 22 was provided, the energized deterioration was hardly generated. This is considered to be because a basal plane dislocation DBb extending from the basal plane dislocation Dba being present deeper than the conversion point PN (lower side in the drawing) at the time of a bipolar operation hardly further extended after reaching the second silicon carbide layer 22.

To inspect the above, a silicon carbide epitaxial substrate including only a concentration-gradient layer in which impurity concentration thereof is gradually lowered (layer similar to buffer layer 29 (FIG. 8) to be described later) was prepared as the epitaxial layer directly on the silicon carbide single-crystal substrate 10. This silicon carbide epitaxial substrate was irradiated with an ultraviolet laser in order to generate pseudo energized deterioration. A stacking fault thus expanded was observed from an epitaxial growth surface side. As a result, a width of the stacking fault was narrower at positions where the impurity concentration was higher. From the above, the reason why a high impurity-concentration layer suppresses the expansion of the basal plane dislocation (i.e., a stacking fault) is considered to be because the stacking fault (i.e., two partial dislocations fringing the stacking fault) is hardly moved inside the high impurity-concentration layer. It is known that the stacking fault expands through movement of one partial dislocation called a Si core, out of the two partial dislocations, inside the crystal. The partial dislocation of the Si core has a tendency to move to a side having lower impurity concentration. For this reason, it is necessary that the impurity concentration of the second silicon carbide layer 22 (third impurity concentration) be higher than the impurity concentration of the silicon carbide single-crystal substrate 10 (first impurity concentration), preferably having doubled impurity concentration or more with respect thereto. Note that, when the impurity concentration of the second silicon carbide layer 22 exceeds $2\times10^{19}$ cm$^{-3}$, new crystal defects are liable to be generated at the time of epitaxial growth. For this reason, it is preferable that the impurity concentration of the second silicon carbide layer 22 be $2\times10^{19}$ cm$^{-3}$ or less.

According to the PIN diode 100 (FIG. 1) of this embodiment, the basal plane dislocation DBa inside the silicon carbide single-crystal substrate 10 is converted into the threading edge dislocation DT by the first silicon carbide layer 21 at the time of epitaxial growth for manufacturing the silicon carbide epitaxial substrate 51 (FIG. 2). With this, propagation of the basal plane dislocation into the third silicon carbide layer 23 is suppressed at the time of epitaxial growth. Further, at the time of a bipolar operation utilizing a pin structure obtained by a stacking structure of the fourth silicon carbide layer 124, the third silicon carbide layer 23, and the silicon carbide single-crystal substrate 10, the extension of the basal plane dislocation DBb (FIG. 5) advancing toward the third silicon carbide layer 23 from the first silicon carbide layer 21 is hindered by the second silicon carbide layer 22. Thus, at the time of a bipolar operation, energized deterioration due to the extension and expansion of the basal plane dislocation inside the third silicon carbide layer 23 can be suppressed.

In the PIN diode 100 (FIG. 1), the cathode electrode 101 is electrically connected to the silicon carbide single-crystal substrate 10, and the anode electrode 102 is electrically connected to the fourth silicon carbide layer 124. With this, a vertical-type semiconductor device having the cathode electrode 101 and the anode electrode 102 as main electrodes thereof is formed. The energized deterioration at the time of a bipolar operation is liable to be a problem in the vertical-type silicon carbide semiconductor device, but such a problem can be suppressed with this embodiment.

Further, the cathode electrode 101 is brought into an ohmic contact with the silicon carbide single-crystal substrate 10, and the anode electrode 102 is brought into an ohmic contact with the fourth silicon carbide layer 124. With this, a portion between the cathode electrode 101 and the anode electrode 102 is connected with the pin structure obtained by the stacking structure of the fourth silicon carbide layer 124, the third silicon carbide layer 23, and the silicon carbide single-crystal substrate 10. Hitherto, energized deterioration was liable to be generated in the bipolar operation utilizing this pin structure, but the energized deterioration can be suppressed with this embodiment.

According to the silicon carbide epitaxial substrate 51 (FIG. 2) of this embodiment, the basal plane dislocation DBa inside the silicon carbide single-crystal substrate 10 is converted into the threading edge dislocation DT by the first silicon carbide layer 21 at the time of epitaxial growth for manufacturing the silicon carbide epitaxial substrate 51. With this, propagation of the basal plane dislocation into the third silicon carbide layer 23 is suppressed at the time of epitaxial growth. Further, the extension of the basal plane dislocation DBb advancing toward the third silicon carbide layer 23 from the first silicon carbide layer 21 is hindered by the second silicon carbide layer 22 at the time of a bipolar operation of the PIN diode 100 (FIG. 1) using this silicon carbide epitaxial substrate 51. Thus, at the time of a bipolar operation, energized deterioration due to the extension and expansion of the basal plane dislocation inside the third silicon carbide layer 23 can be suppressed.

Preferably, the impurity concentration of the third silicon carbide layer 23 (fourth impurity concentration) is lower than the impurity concentration of the first silicon carbide layer 21 (second impurity concentration). With this, the impurity concentration of the third silicon carbide layer 23 can be lowered adequately. Thus, a withstand voltage of the PIN diode 100 (FIG. 1) using the silicon carbide epitaxial substrate 51 can be enhanced as compared to a case where the fourth impurity concentration is higher than the second impurity concentration.

Preferably, the impurity concentration of the second silicon carbide layer 22 (third impurity concentration) is $2 \times 10^{19}$ cm$^{-3}$ or less. With this, generation of a stacking fault at the time of forming the second silicon carbide layer 22 can be suppressed.

Figure 6:
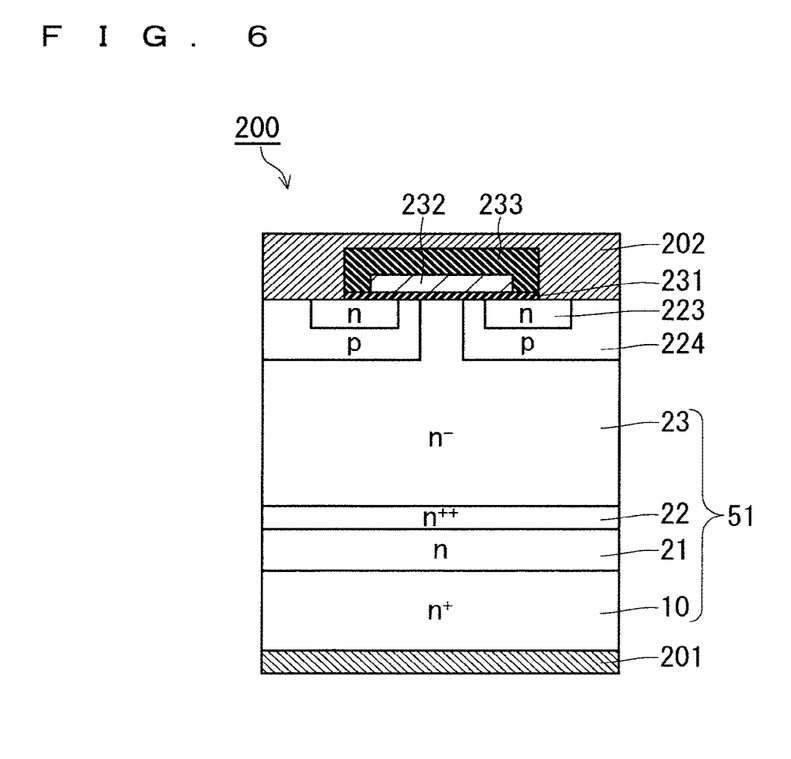
FIG. 6 is a sectional view schematically illustrating a configuration of the silicon carbide semiconductor device of a first modified example according to the first embodiment of the present invention.
Figure 7:
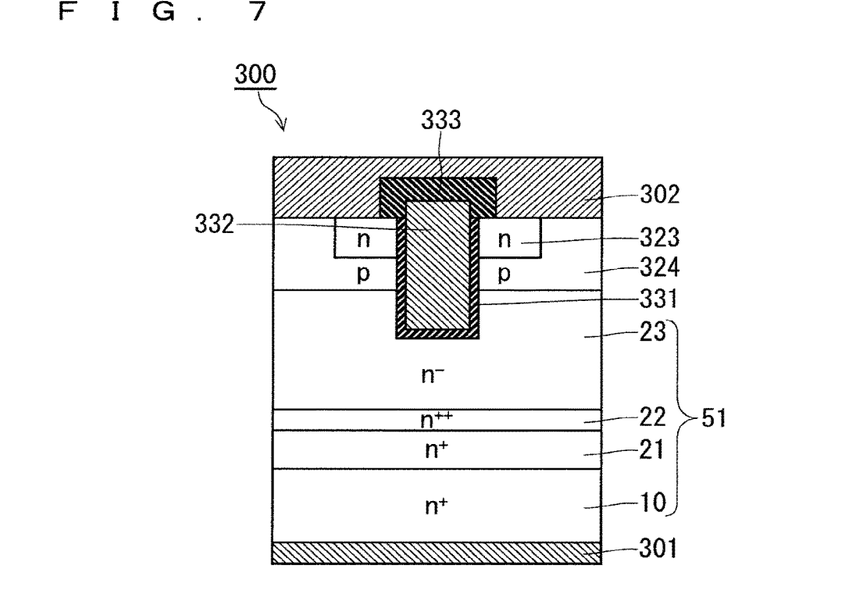
FIG. 7 is a sectional view schematically illustrating a configuration of the silicon carbide semiconductor device of a second modified example according to the first embodiment of the present invention.

Note that, the silicon carbide semiconductor device is not to be limited to the PIN diode 100 (FIG. 1), and other bipolar devices may be employed. As described above, even a metal oxide semiconductor field effect transistor (MOSFET), which is in many cases categorized as a unipolar device in general, corresponds to the "bipolar device" as used in this specification in a case where a parasitic PIN diode thereof may operate as a bipolar element. The MOSFET may be a planar-gate MOSFET 200 (FIG. 6). The planar-gate MOSFET 200 (FIG. 6) includes the silicon carbide epitaxial substrate 51, a base layer 224 (fourth silicon carbide layer), a source layer 223, a gate insulation film 231, a gate electrode 232, a drain electrode 201 (first electrode), and a source electrode 202 (second electrode). Further, the MOSFET may be a trench-gate MOSFET 300 (FIG. 7). The trench-gate MOSFET 300 includes the silicon carbide epitaxial substrate 51, a base layer 324 (fourth silicon carbide layer), a source layer 323, a gate insulation film 331, a gate electrode 332, a drain electrode 301 (first electrode), and a source electrode 302 (second electrode).

Second Embodiment

Figure 8:
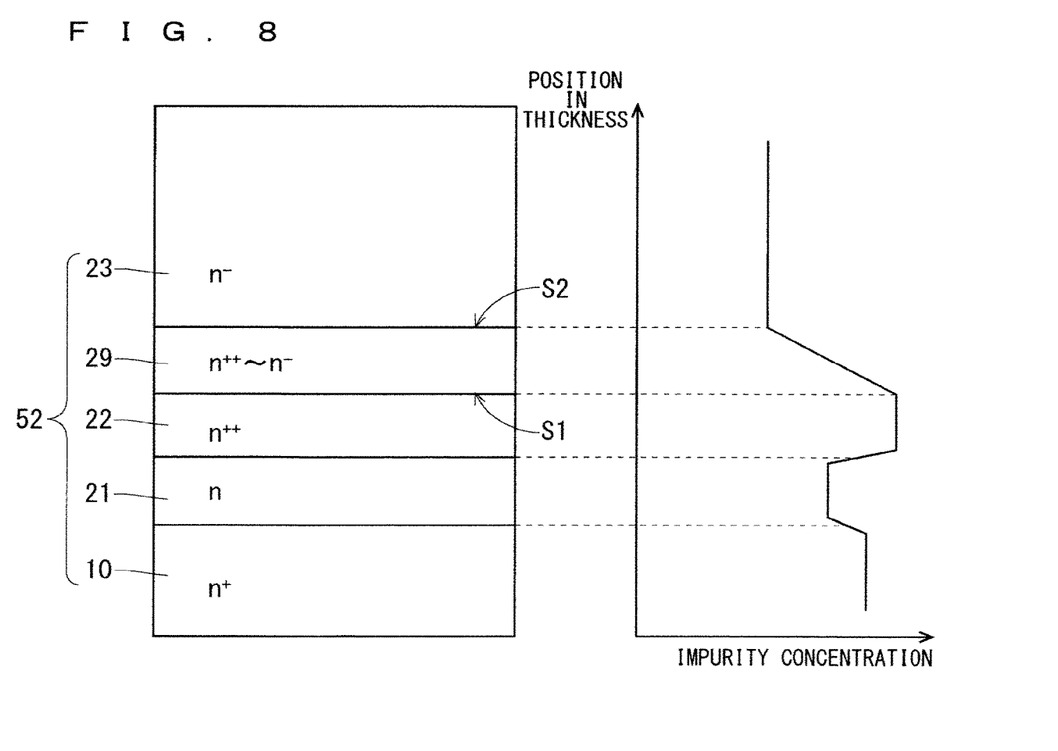
FIG. 8 is a view illustrating a sectional view schematically illustrating a configuration of the silicon carbide epitaxial substrate according to a second embodiment of the present invention, and a schematic profile of impurity concentration thereof.

With reference to FIG. 8, a silicon carbide epitaxial substrate 52 of this embodiment includes a buffer layer 29. The buffer layer 29 has a first surface S1 and a second surface S2 that is opposite to the first surface S1. The buffer layer 29 is made of silicon carbide. The buffer layer 29 may be formed through epitaxial growth on the second silicon carbide layer 22.

The first surface S1 faces the second silicon carbide layer 22, and the second surface S2 faces the third silicon carbide layer 23. The first surface S1 may directly face the second silicon carbide layer 22. The second surface S2 may directly face the third silicon carbide layer 23. The first surface S1 directly faces the second silicon carbide layer 22 and the second surface S2 directly faces the third silicon carbide layer 23, thus allowing the third silicon carbide layer 23 to be provided with intermediation of only the buffer layer 29 on the second silicon carbide layer 22. The buffer layer 29 has a profile of impurity concentration that continuously reduces from the first surface S1 toward the second surface S2.

It is preferable that the profile of impurity concentration of the buffer layer 29 change linearly as illustrated in FIG. 8; however, the profile need not be linear as long as the profile does not have abrupt change, and is allowable as long as the profile has continuous change as described above. Conversely, in a case where the profile of impurity concentration has a stepwise structure that changes non-continuously (i.e., discretely), new crystal defects are liable to be generated in the non-continuous interface at the time of epitaxial growth. This is because a lattice constant of the crystal also becomes non-continuous in an interface having non-continuous impurity concentration, resulting in generating strain. For example, in the buffer layer 29 having a thickness of approximately 10 μm, the impurity concentration is designed to be reduced by approximately $2 \times 10^{18}$ cm$^{-3}$ per 1 μm in thickness from the first surface S1 toward the second surface S2. With this, the change of the impurity concentration can be prevented from being abrupt in an interface between the buffer layer 29 and the third silicon carbide layer 23.

In order to further reduce the generation of new crystal defects in the third silicon carbide layer 23 as an active layer, it is preferable that, as illustrated in the profile of impurity concentration of FIG. 8, each of the layers is connected so that the impurity concentration changes smoothly to prevent concentration change from being abrupt in other interfaces as well. In this case, strictly speaking, it can be said that a buffer layer (not shown in the sectional view of FIG. 8) is provided not only between the second silicon carbide layer 22 and the third silicon carbide layer 23 but also between the silicon carbide single-crystal substrate 10 and the first silicon carbide layer and between the first silicon carbide layer and the second silicon carbide layer.

Configuration other than the above is substantially the same as the configuration of the above-mentioned silicon carbide epitaxial substrate 51 (FIG. 2: first embodiment), and hence the same or corresponding components are denoted by the same reference symbols not to repeat description thereof.

According to this embodiment, owing to the buffer layer 29, abrupt change in the impurity concentration between the second silicon carbide layer 22 and the third silicon carbide layer 23 is suppressed. With this, generation of new crystal defects at the time of epitaxial growth can be suppressed. Thus, the effects described in the first embodiment can further be enhanced. Note that, with use of the silicon carbide epitaxial substrate 52, a silicon carbide semiconductor device that is substantially the same as that of the first embodiment can be manufactured.

Third Embodiment

Figure 9:
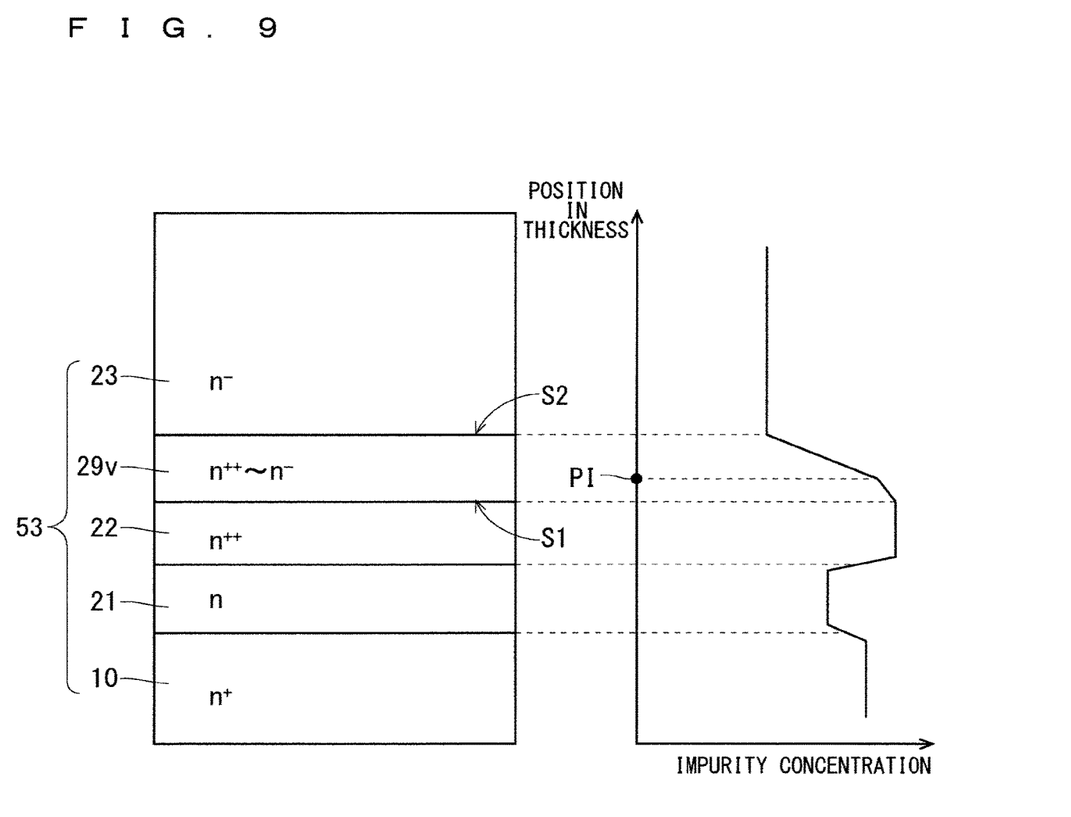
FIG. 9 is a view illustrating a sectional view schematically illustrating a configuration of the silicon carbide epitaxial substrate according to a third embodiment of the present invention, and a schematic profile of impurity concentration thereof.

With reference to FIG. 9, a silicon carbide epitaxial substrate 53 of this embodiment includes a buffer layer 29v instead of the buffer layer 29 of the silicon carbide epitaxial substrate 52 in the second embodiment (FIG. 8). Similarly to the buffer layer 29, the buffer layer 29v has a first surface S1 and a second surface S2 that is opposite to the first surface S1. The buffer layer 29v is made of silicon carbide. The buffer layer 29v may be formed through epitaxial growth on the second silicon carbide layer 22.

Similarly to the second embodiment, the first surface S1 faces the second silicon carbide layer 22, and the second surface S2 faces the third silicon carbide layer 23. The first surface S1 may directly face the second silicon carbide layer 22. The second surface S2 may directly face the third silicon carbide layer 23. The first surface S1 directly faces the second silicon carbide layer 22 and the second surface S2 directly faces the third silicon carbide layer 23, thus allowing the third silicon carbide layer 23 to be provided with intermediation of only the buffer layer 29v on the second silicon carbide layer 22. The buffer layer 29v has a profile of impurity concentration that continuously reduces from the first surface S1 toward the second surface S2.

A point between the first surface S1 and the second surface S2 is herein represented as an intermediate point PI. The intermediate point PI only needs to be a point located between the first surface S1 and the second surface S2 and distant from each of the first surface S1 and the second surface S2, and need not be located equally distant from the first surface S1 and the second surface S2. According to this embodiment, the buffer layer 29v has a profile of impurity concentration in which impurity concentration thereof continuously reduces at a first reduction rate from the first surface S1 toward the intermediate point PI, and continuously reduces at a second reduction rate from the intermediate point PI toward the second surface S2. The first reduction rate is smaller than the second reduction rate.

Comparing the buffer layer 29 (FIG. 8) and the buffer layer 29v (FIG. 9) for the profiles of impurity concentration thereof, change in impurity concentration from directly above the second silicon carbide layer 22 to the intermediate point PI in a thickness direction of the buffer layer 29v is designed to be more gentle in the buffer layer 29v. With this, generation of strain in the interface between the second silicon carbide layer 22 and the third silicon carbide layer 23 is suppressed. Thus, generation of new crystal defects can further be suppressed.

The buffer layer 29v is formed as follows, for example. First, a first silicon carbide region having a thickness of 10 µm is deposited on the second silicon carbide layer 22 such that the impurity concentration is reduced by $2 \times 10^{17}$ cm$^{-3}$ per 1 µm in thickness (first reduction rate) toward the surface. A second silicon carbide region having a thickness of 5 µm is deposited on the first silicon carbide region such that the impurity concentration is reduced by $2 \times 10^{18}$ cm$^{-3}$ per 1 µm in thickness (second reduction rate) toward the surface. With this, the buffer layer 29v having a total thickness of 15 µm is formed, and a position of an interface between the first silicon carbide region and the second silicon carbide region corresponds to the intermediate point PI.

Note that, in the above-mentioned example, the intermediate point PI corresponds to a point at which the profile of impurity concentration is kinked. However, the intermediate point PI need not necessarily be such a point, and only needs to be determined virtually so that the profile of impurity concentration satisfies the above-mentioned conditions. Further, in the above-mentioned example, each of the first and second reduction rates is constant, but those may change in the thickness direction. In other words, in each of the above-mentioned first and second silicon carbide regions, the profile of impurity concentration need not necessarily change in a straight line, but may change in a curved line. In such a case, it suffices that each of the first and second reduction rates be represented by a mean value.

The configuration of the silicon carbide epitaxial substrate 53 other than the above is substantially the same as the configuration of the silicon carbide epitaxial substrate 52 described above (FIG. 8: second embodiment), and hence the same or corresponding components are denoted by the same reference symbols not to repeat description thereof.

Note that, in each of the above-mentioned embodiments, description is given to the case supposing that the "one conductivity type" is an n-type, but the "one conductivity type" may be a p-type.

EXAMPLES

First Example

As the silicon carbide single-crystal substrate 10 (FIG. 2), a silicon carbide substrate was prepared, which had an off-angle of 4 degrees, a diameter of 75 mm (3 inches), a crystal polymorph of 4H, a conductivity of an n-type, and impurity concentration of $5 \times 10^{18}$ cm$^{-3}$. A surface of the silicon carbide substrate was processed into a mirror-finished surface in advance through mechanical polishing and chemical mechanical polishing. The density of basal plane dislocations in the surface was 500 cm$^{-2}$.

Next, surface washing was conducted to remove organic contamination, metal contamination, and the like that were present in this surface. Specifically, first, the silicon carbide single-crystal substrate 10 was immersed in a heated mixed solution of aqueous ammonia and a hydrogen peroxide solution. Next, the silicon carbide single-crystal substrate 10 was immersed in a heated mixed solution of hydrochloric acid and a hydrogen peroxide solution. Next, the silicon carbide single-crystal substrate 10 was immersed in an aqueous solution containing hydrogen fluoride. Next, substitution process with pure water was conducted. Next, the silicon carbide single-crystal substrate 10 was dried. In the surface before surface washing, foreign matters such as metallic elements may be present, for example. Such foreign matters may be a cause of generation of new crystal defects at the time of epitaxial growth.

Note that, a hydrogen gas to be described later that is introduced in an initial phase of epitaxial growth also has an effect of removing surface contamination. However, it is desirable that the foreign matters on the surface be removed before the silicon carbide single-crystal substrate 10 is introduced into a reactor for epitaxial growth not only in the sense of performing the surface washing adequately but also in the sense of maintaining cleanliness inside a growth furnace.

Subsequently, the silicon carbide single-crystal substrate 10 was introduced into a reactor of a CVD device for epitaxial growth. Temperature inside the reactor was set to be 1,575° C. A silicon-carbide source gas and an impurity source gas were introduced after starting supply of a hydrogen gas being a carrier gas, thereby initiating epitaxial growth. Specifically, with adjustment of a flow rate of the silicon-carbide gas and the impurity source gas, first, the first silicon carbide layer 21 having impurity concentration of $5 \times 10^{17}$ cm$^{-3}$ was formed with a thickness thereof being 500 nm. Subsequently, with adjustment of a flow rate of a nitrogen gas, the second silicon carbide layer 22 having impurity concentration of $1 \times 10^{19}$ cm$^{-3}$ was formed with a thickness thereof being 1 µm. Further, the third silicon carbide layer 23 having impurity concentration of $3 \times 10^{16}$ cm$^{-3}$ was formed with a thickness thereof being 10 µm. As the silicon-carbide source gas, monosilane and propane were used. As the impurity source gas, a gas containing nitrogen (N) atoms, specifically, a nitrogen gas, was used. Note that, a gas containing phosphorus (P) atoms may also be used instead of the nitrogen gas. Further, in a case where the epitaxial layer to grow is a p-type, a gas containing aluminium (Al) atoms or boron (B) atoms may be used.

From the above, the silicon carbide epitaxial substrate 51 was obtained. When a photoluminescence image of the entire silicon carbide epitaxial substrate 51 was acquired, the density of basal plane dislocations inside the third silicon carbide layer 23 was 300 cm$^{-2}$. Using this silicon carbide epitaxial substrate 51, the PIN diode 100 (FIG. 1) being a bipolar element was manufactured. Out of a plurality of manufactured elements, an element in which the basal plane dislocation was absent inside the third silicon carbide layer 23 as an active layer was selected. A forward energization was performed on the element with a current density of 50 A cm$^{-2}$ for 60 minutes. As a result, no change was observed in properties of the diode. Further, as for an element in which the basal plane dislocation was present inside the third silicon carbide layer 23 as an active layer, a sectional structure of the basal plane dislocation was observed. As a result, the basal plane dislocation was formed from the interface between the second silicon carbide layer 22 and the third silicon carbide layer 23.

Second Example

An epitaxial growth layer was formed on the silicon carbide single-crystal substrate 10 (FIG. 8) that is prepared similarly to the first example. Specifically, first, growth was initiated under a state in which the flow rate of the nitrogen gas was adjusted so that the impurity concentration became 5×10$^{18}$ cm$^{-3}$. The flow rate of the nitrogen gas was reduced at a constant rate simultaneously with the start of the growth, and thus such a buffer layer as to have impurity concentration linearly reducing from 5×10$^{18}$ cm$^{-3}$ to 5×10$^{17}$ cm$^{-3}$ was formed on the silicon carbide single-crystal substrate 10 with a thickness thereof being 200 nm. Subsequently, the first silicon carbide layer 21 having impurity concentration of 5×10$^{17}$ cm$^{-3}$ was formed. Next, after such a buffer layer as to have impurity concentration linearly increasing from 5×10$^{17}$ cm$^{-3}$ to 1×10$^{19}$ cm$^{-3}$ was grown with a thickness thereof being 500 nm, the second silicon carbide layer 22 having impurity concentration of 1×10$^{19}$ cm$^{-3}$ was formed with a thickness thereof being 500 nm. Further, such a buffer layer 29 as to have impurity concentration linearly reducing from 5×10$^{19}$ cm$^{-3}$ to 3×10$^{16}$ cm$^{-3}$ was formed with a thickness thereof being 10 μm. The third silicon carbide layer 23 having impurity concentration of 3×10$^{16}$ cm$^{-3}$ was formed on the buffer layer 29 with a thickness thereof being 10 μm.

From the above, the silicon carbide epitaxial substrate 52 was obtained. When a photoluminescence image of the entire silicon carbide epitaxial substrate 52 was acquired, the density of basal plane dislocations inside the third silicon carbide layer 23 was 50 cm$^{-2}$. A sectional structure of those basal plane dislocations was observed, finding that the basal plane dislocations propagated from the silicon carbide single-crystal substrate 10. Using the silicon carbide epitaxial substrate 52, the PIN diode being a bipolar element was manufactured. Out of a plurality of manufactured elements, an element in which the basal plane dislocation was absent inside the third silicon carbide layer 23 as an active layer was selected. A forward energization was performed on the element with a current density of 50 A cm$^{-2}$ for 60 minutes. As a result, no change was observed in properties of the diode.

Comparative Example

An epitaxial growth layer was formed on the silicon carbide single-crystal substrate 10 (FIG. 3) that is prepared similarly to the first example. Specifically, first, the first silicon carbide layer 21 having impurity concentration of 5×10$^{17}$ cm$^{-3}$ was formed with a thickness thereof being 500 nm. Subsequently, with adjustment of the flow rate of the nitrogen gas, the third silicon carbide layer 23 having impurity concentration of 3×10$^{16}$ cm$^{-3}$ was formed with a thickness thereof being 10 μm. From the above, the silicon carbide epitaxial substrate 59 was obtained. When a photoluminescence image of the silicon carbide epitaxial substrate 59 was acquired, the density of basal plane dislocations inside the third silicon carbide layer 23 was 100 cm$^{-2}$. Using the silicon carbide epitaxial substrate 59, the PIN diode being a bipolar element was manufactured.

Out of a plurality of manufactured elements, an element in which the basal plane dislocation was absent inside the third silicon carbide layer 23 as an active layer was selected. A forward energization was performed on the element with a current density of 50 A cm$^{-2}$ for 60 minutes. As a result, increase in forward voltage drop was observed along with the energization. A photoluminescence image of the element observed to have such deterioration was acquired after removing electrodes and the like thereof. As a result, expanded stacking faults were observed. As a result of observing a sectional structure in the vicinity of the positions at which the stacking faults crossed in an interface between the silicon carbide single-crystal substrate 10 and the first silicon carbide layer 21, the following states were observed inside the first silicon carbide layer 21 (FIG. 4) that the basal plane dislocation DBa propagating from the silicon carbide single-crystal substrate 10 was converted into the threading edge dislocation DT, and that the basal plane dislocation DBz extended from the basal plane dislocation DBa (i.e., a stacking fault) on the lower side with respect to the conversion point PN to the third silicon carbide layer 23.

Note that, in the present invention, each of the embodiments may be freely combined, and each of the embodiments may be modified or omitted as appropriate within the scope of the invention. The present invention has been described in detail, but the description above is merely an example in any aspect, and the present invention is not to be limited thereto. It is understood that numerous modified examples not exemplified herein are assumable without departing from the scope of the present invention.

EXPLANATION OF REFERENCE SIGNS

S1 first surface, S2 second surface, DT threading edge dislocation, PN conversion point, DBa, DBb, DBz basal plane dislocation, 10 silicon carbide single-crystal substrate, 21 first silicon carbide layer, 22 second silicon carbide layer, 23 third silicon carbide layer, third epitaxial layer, 29, 29v buffer layer, 51-53 silicon carbide epitaxial substrate, 100 PIN diode (silicon carbide semiconductor device), 101 cathode electrode (first electrode), 102 anode electrode (second electrode), 123 JTE region, 124 fourth silicon carbide layer, 133 insulation film, 200 planar-gate MOSFET (silicon carbide semiconductor device), 300 trench-gate MOSFET (silicon carbide semiconductor device), 201, 301 drain electrode (first electrode), 202, 302 source electrode (second electrode), 223, 323 source layer, 224, 324 base layer (fourth silicon carbide layer), 231, 331 gate insulation film, 232, 332 gate electrode.

The invention claimed is:

1. A silicon carbide epitaxial substrate comprising:
a silicon carbide single-crystal substrate of one conductivity type having a first impurity concentration;
a first silicon carbide layer of the one conductivity type being provided on the silicon carbide single-crystal substrate, and having a second impurity concentration that is lower than the first impurity concentration;
a second silicon carbide layer of the one conductivity type being provided on the first silicon carbide layer, and having a third impurity concentration that is higher than the first impurity concentration; and
a third silicon carbide layer of the one conductivity type being provided on the second silicon carbide layer, and having a fourth impurity concentration that is lower than the second impurity concentration,
wherein the first impurity concentration of the silicon carbide single-crystal substrate is substantially uniform in a thickness direction.

2. The silicon carbide epitaxial substrate according to claim 1, wherein the third impurity concentration is $2\times10^{19}$ cm$^{-3}$ or less.

3. The silicon carbide epitaxial substrate according to claim 1, wherein the third impurity concentration is $5\times10^{18}$ cm$^{-3}$ or more.

4. The silicon carbide epitaxial substrate according to claim 1, wherein the second impurity concentration is $5\times10^{16}$ cm$^{-3}$ or more and $1\times10^{19}$ cm$^{-3}$ or less.

5. The silicon carbide epitaxial substrate according to claim 1, wherein the fourth impurity concentration is $1\times10^{14}$ cm$^{-3}$ or more and $5\times10^{16}$ cm$^{-3}$ or less.

6. The silicon carbide epitaxial substrate according to claim 1, wherein an impurity concentration between the silicon carbide single-crystal substrate and the first silicon carbide layer transitions monotonically from said first impurity concentration to said second impurity concentration.

7. The silicon carbide epitaxial substrate according to claim 1, wherein
the silicon carbide single-crystal substrate comprises a 4H crystal structure;
the first silicon carbide layer comprises an epitaxial layer formed on the silicon carbide single-crystal substrate;
the second silicon carbide layer comprises an epitaxial layer formed on the first silicon carbide layer; and
the third silicon carbide layer comprises an epitaxial layer formed on the second silicon carbide layer.

8. The silicon carbide epitaxial substrate according to claim 7, wherein the silicon carbide single-crystal substrate, the first silicon carbide layer, the second silicon carbide layer, and the third silicon carbide layer are directly formed on each other.

9. The silicon carbide epitaxial substrate according to claim 1, wherein a difference between the second impurity concentration and the third impurity concentration and a difference between the third impurity concentration and the fourth impurity concentration are given by a concentration difference of impurity atoms different from protons.

10. The silicon carbide epitaxial substrate according to claim 1, wherein a difference between the second impurity concentration and the third impurity concentration and a difference between the third impurity concentration and the fourth impurity concentration are given by a concentration difference of impurities including atoms of at least one of nitrogen, phosphorus, aluminum and boron.

11. The silicon carbide epitaxial substrate according to claim 1, wherein the second and fourth impurity concentrations are both lower than the first impurity concentration.

12. A silicon carbide semiconductor device comprising:
a silicon carbide single-crystal substrate of one conductivity type having a first impurity concentration;
a first silicon carbide layer of the one conductivity type being provided on the silicon carbide single-crystal substrate, and having a second impurity concentration that is lower than the first impurity concentration;
a second silicon carbide layer of the one conductivity type being provided on the first silicon carbide layer, and having a third impurity concentration that is higher than the first impurity concentration;
a third silicon carbide layer of the one conductivity type being provided on the second silicon carbide layer, and having a fourth impurity concentration that is lower than the second impurity concentration; and
a fourth silicon carbide layer of a conductivity type different from the one conductivity type provided on the third silicon carbide layer,
wherein the first impurity concentration is substantially uniform in a thickness direction.

13. The silicon carbide semiconductor device according to claim 12, further comprising:
a first electrode that is electrically connected to the silicon carbide single-crystal substrate; and
a second electrode that is electrically connected to the fourth silicon carbide layer.

14. The silicon carbide semiconductor device according to claim 13, wherein the first electrode is brought into an ohmic contact with the silicon carbide single-crystal substrate, and the second electrode is brought into an ohmic contact with the fourth silicon carbide layer.

15. The silicon carbide semiconductor device according to claim 12, comprising an electrode directly connected to the silicon carbide single-crystal substrate.

16. The silicon carbide semiconductor device according to claim 12, comprising no intervening layer being present between the silicon carbide single-crystal substrate and the first silicon carbide layer.

17. The silicon carbide epitaxial substrate according to claim 1, comprising an electrode directly connected to the silicon carbide single-crystal substrate.

18. The silicon carbide epitaxial substrate according to claim 1, comprising no intervening layer being present between the silicon carbide single-crystal substrate and the first silicon carbide layer.

19. The silicon carbide epitaxial substrate according to claim 12, wherein the second and fourth impurity concentrations are both lower than the first impurity concentration.

* * * * *